United States Patent
Kanegae et al.

(10) Patent No.: US 8,907,341 B2
(45) Date of Patent: Dec. 9, 2014

(54) THIN-FILM SEMICONDUCTOR DEVICE AND METHOD FOR FABRICATING THIN-FILM SEMICONDUCTOR DEVICE

(71) Applicant: Panasonic Corporation, Osaka (JP)

(72) Inventors: Arinobu Kanegae, Kyoto (JP); Takahiro Kawashima, Osaka (JP)

(73) Assignee: Panasonic Corporation, Osaka (JP)

( * ) Notice: Subject to any disclaimer, the term of this patent is extended or adjusted under 35 U.S.C. 154(b) by 83 days.

(21) Appl. No.: 13/710,969

(22) Filed: Dec. 11, 2012

(65) Prior Publication Data

US 2013/0105798 A1    May 2, 2013

Related U.S. Application Data

(63) Continuation of application No. PCT/JP2011/006046, filed on Oct. 28, 2011.

(51) Int. Cl.

| | | |
|---|---|---|
| *H01L 29/04* | (2006.01) | |
| *H01L 31/20* | (2006.01) | |
| *H01L 27/04* | (2006.01) | |
| *H01L 21/77* | (2006.01) | |
| *H01L 27/12* | (2006.01) | |
| *H01L 29/423* | (2006.01) | |
| *H01L 29/49* | (2006.01) | |
| *H01L 29/786* | (2006.01) | |
| *G02F 1/1362* | (2006.01) | |
| *H01L 27/32* | (2006.01) | |

(52) U.S. Cl.
CPC .............. *H01L 27/04* (2013.01); *H01L 21/77* (2013.01); *H01L 27/124* (2013.01); *H01L 27/1255* (2013.01); *H01L 27/1288* (2013.01); *H01L 29/42384* (2013.01); *H01L 29/4908* (2013.01); *H01L 29/78633* (2013.01); *G02F 1/136213* (2013.01); *H01L 27/3262* (2013.01)

USPC ............................... 257/57; 257/71; 438/152

(58) Field of Classification Search
CPC ... H01L 27/124; H01L 29/4908; H01L 21/77; H01L 27/04; H01L 27/3265
USPC ........................................ 257/57, 71; 438/152
See application file for complete search history.

(56) References Cited

U.S. PATENT DOCUMENTS

| | | |
|---|---|---|
| 6,500,701 B2 | 12/2002 | Higashi et al. |
| 6,653,216 B1 | 11/2003 | Shimomaki et al. |
| 6,678,017 B1 | 1/2004 | Shimomaki et al. |
| 6,855,954 B1 | 2/2005 | Zhang |
| 8,218,099 B2 | 7/2012 | Yamazaki et al. |
| 2001/0036680 A1 | 11/2001 | Higashi et al. |

(Continued)

FOREIGN PATENT DOCUMENTS

| | | |
|---|---|---|
| JP | 64-004071 | 1/1989 |
| JP | 09-008311 | 1/1997 |

(Continued)

*Primary Examiner* — Theresa T Doan
(74) *Attorney, Agent, or Firm* — Greenblum & Bernstein, P.L.C.

(57) ABSTRACT

A thin-film semiconductor device includes a semiconductor device part and a capacitor part. The semiconductor device part includes: a light-transmitting first gate electrode; a light-shielding second gate electrode; a first insulating layer; a semiconductor layer; a second insulating layer; and a source electrode and a drain electrode. The capacitor part includes: a first capacitor electrode made of a light-transmitting conductive material; a dielectric layer; and a second capacitor electrode. The second gate electrode, the semiconductor layer, and the second insulating layer have outlines that are coincident with one another in a top view.

12 Claims, 21 Drawing Sheets

(56) References Cited

U.S. PATENT DOCUMENTS

| | | | |
|---|---|---|---|
| 2006/0024895 A1* | 2/2006 | Kim | 438/299 |
| 2010/0155719 A1 | 6/2010 | Sakata et al. | |
| 2010/0309101 A1 | 12/2010 | Kanegae et al. | |
| 2011/0058116 A1 | 3/2011 | Yamazaki et al. | |
| 2011/0128211 A1 | 6/2011 | Ono | |
| 2012/0074423 A1 | 3/2012 | Kanegae | |

FOREIGN PATENT DOCUMENTS

| | | |
|---|---|---|
| JP | 2001-119029 | 4/2001 |
| JP | 2001-343659 | 12/2001 |
| JP | 2010-166038 | 7/2010 |
| JP | 2010-287634 | 12/2010 |
| JP | 2011-077517 | 4/2011 |
| JP | 2011-091110 | 5/2011 |

* cited by examiner

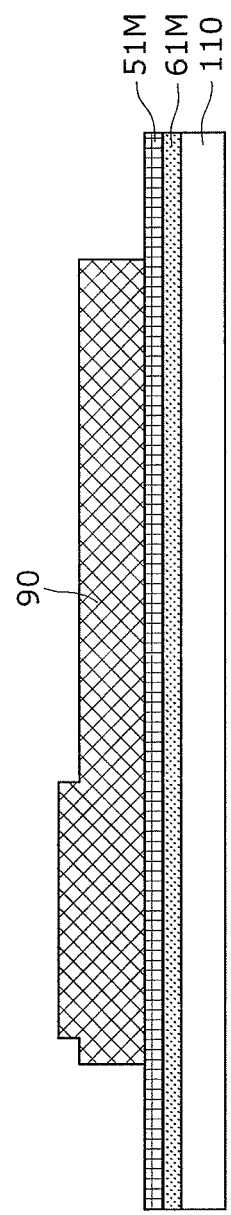

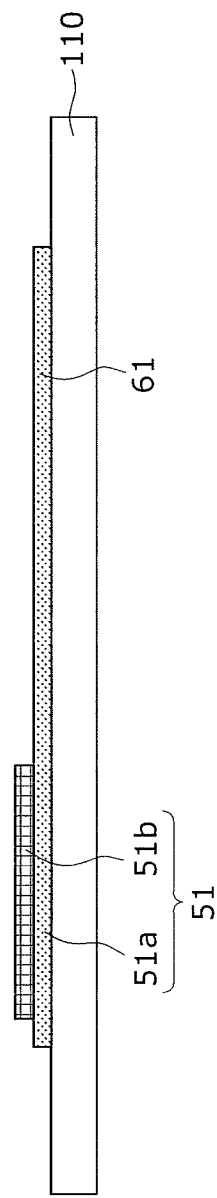

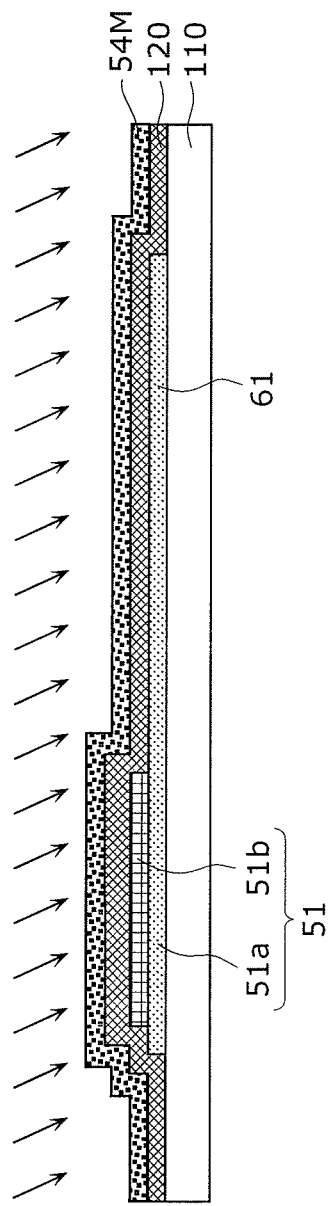

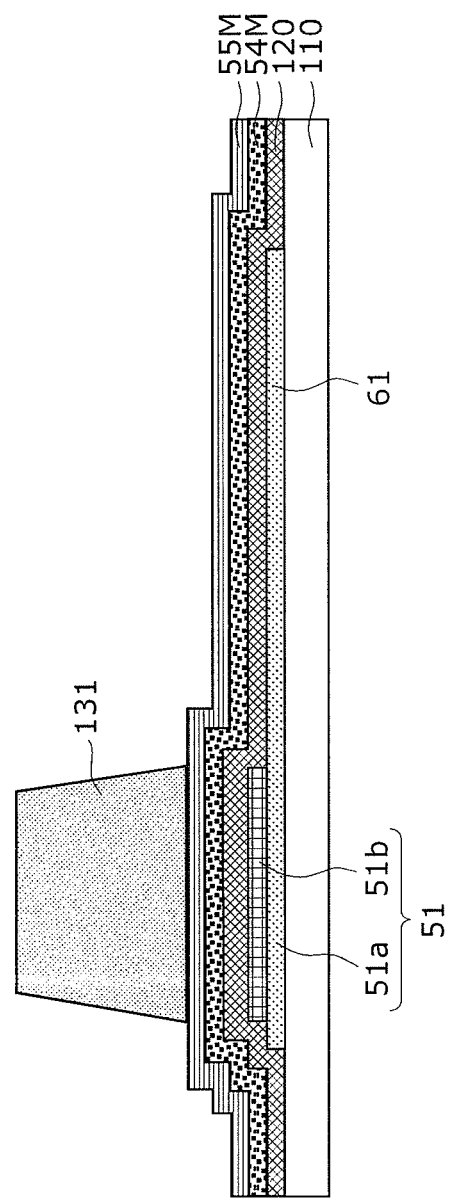

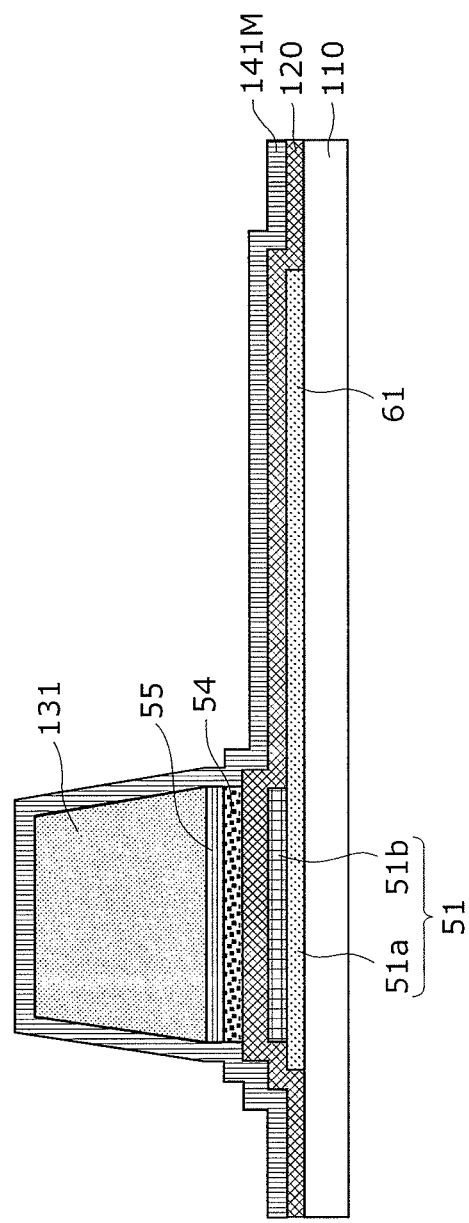

THIN-FILM SEMICONDUCTOR DEVICE AND METHOD FOR FABRICATING THIN-FILM SEMICONDUCTOR DEVICE

CROSS REFERENCE TO RELATED APPLICATION

This is a continuation application of PCT Patent Application No. PCT/JP2011/006046 filed on Oct. 28, 2011, designating the United States of America. The entire disclosure of the above-identified application, including the specification, drawings and claims is incorporated herein by reference in their entirety.

TECHNICAL FIELD

One or more exemplary embodiments disclosed herein relate generally to a thin-film semiconductor device used for pixel circuits in a display device.

BACKGROUND ART

In recent years, organic EL displays using electroluminescence (EL) of an organic material have been attracting attention as a type of next-generation flat panel display replacing liquid crystal displays.

Unlike the voltage-driven liquid crystal display, the organic EL display is a current-driven display device. Accordingly, there is an urgent need for development of a thin-film transistor having excellent characteristics as a driving circuit for the active-matrix display device. The TFT is used as a switching device for selecting a pixel or a driving transistor for driving the pixel.

With reference to FIG. 11, a configuration of a conventional pixel circuit shall be described. A pixel circuit 900 illustrated in FIG. 11 includes a substrate 910, and a semiconductor device part and a capacitor part that are formed above the substrate 910. The semiconductor device part is a bottom-gate thin-film transistor formed by stacking a gate electrode 921, a gate insulating film 930, a crystalline silicon layer 941, a non-crystalline silicon layer 951, a channel protective layer 960, a pair of contact layers 971 and 972, a source electrode 981 and a drain electrode 982 above the substrate 910. The capacitor part is formed by stacking a first capacitor electrode 922, a gate insulating film 930 that serves as a dielectric layer, a first silicon layer 942, a second silicon layer 952, a third silicon layer 973, and a second capacitor electrode 983 above the substrate 910.

The semiconductor device part is a channel-protective (etching-stopper) thin-film transistor having the channel protective layer 960 for protecting, from etching, the crystalline silicon layer 941 that serves as a channel layer. The channel-protective thin-film transistor can prevent the damage on the channel layer due to etching, and can suppress the variation in the characteristics in the substrate 910, as disclosed in the patent literatures 1 and 2, for example. Furthermore, with the channel-protective thin-film transistor, it is possible to reduce the thickness of the channel layer. This allows reducing parasitic resistance component, thereby improving the on-characteristics. For that reason, the channel-protective thin-film transistor is useful for improving definition.

CITATION LIST

Patent Literature

[Patent Literature 1] Japanese Unexamined Patent Application Publication No. 2001-119029
[Patent Literature 2] Japanese Unexamined Patent Application Publication No. S64-004071

SUMMARY

Technical Problem

In the pixel circuit 900 with the configuration described above, the channel protective layer 960 is selectively formed at a position overlapping with the channel region of the crystalline silicon layer 941 by patterning an organic material, for example. Here, when the exposure is performed from the back surface side (lower side in FIG. 11) using the gate electrode 921 as a mask, the first capacitor electrode 922 serves as the mask, and the organic material remains in the capacitor part. Accordingly, it is necessary to perform the exposure from the upper surface side (upper side in FIG. 11) in order to pattern the channel protective layer 960. With this process, the width of the channel protective layer 960 becomes narrower than the gate electrode 921, as illustrated in FIG. 11. Thus, parasitic capacitance is generated in the regions on the left and right of the channel protective layer 960 (the regions surrounded by ellipses in FIG. 11), making it difficult to improve the definition.

The crystalline silicon layer 941, the non-crystalline silicon layer 951, and the contact layers 971 and 972 are formed by performing etching using the source electrode 981 and the drain electrode 982 as masks. Here, the second capacitor electrode 983 formed with the same material as the source electrode 981 and the drain electrode 982 serves as a mask, and the first to third silicon layers 942, 952, and 973 remain in the capacitor part. Consequently, the capacitor part becomes metal-insulator-semiconductor (MIS), causing a change in the capacitance value depending on voltage.

One non-limiting and exemplary embodiment provides a thin-film semiconductor device including a semiconductor device part with small parasitic capacitance and a metal-insulator-metal (MIM) capacitor part.

Solution to Problem

In one general aspect, the thin-film semiconductor device disclosed here feature a substrate; and a semiconductor device part and a capacitor part which are above the substrate and apart from each other. The semiconductor device part includes: a light-shielding gate electrode above the substrate; a first insulating layer above the gate electrode; a semiconductor layer above the first insulating layer; a second insulating layer above the semiconductor layer; and a source electrode and a drain electrode that are above the second insulating layer. The capacitor part includes: a first capacitor electrode including a light-transmitting conductive material above the substrate; a dielectric layer including a same material as the first insulating layer, above the first capacitor electrode; and a second capacitor electrode above the dielectric layer, including a conductive material same as at least one of the source electrode and the drain electrode. The second gate electrode, the semiconductor layer, and the second insulating layer have outlines that are coincident with one another in a top view.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

According to the disclosure herein, the thin-film semiconductor device including a semiconductor device part with small parasitic capacitance and an MIM capacitor part can be obtained.

BRIEF DESCRIPTION OF DRAWINGS

These and other advantages and features will become apparent from the following description thereof taken in conjunction with the accompanying Drawings, by way of non-limiting examples of embodiments of the present disclosure.

FIG. 7B is a cross-sectional view schematically illustrating a gate electrode/first capacitor electrode forming process in the method for fabricating the thin-film semiconductor device according to the embodiment.

FIG. 7C is a cross-sectional view schematically illustrating a state in the method for fabricating the thin-film semiconductor device according to the embodiment in which the gate electrode and the first capacitor electrode are formed.

FIG. 7E is a cross-sectional view schematically illustrating a crystalline silicon thin film forming process in the method for fabricating the thin-film semiconductor device according to the embodiment.

FIG. 7H is a cross-sectional view schematically illustrating a channel-protective layer forming process in the method for fabricating thin-film semiconductor device according to the embodiment.

FIG. 7J is a cross-sectional view schematically illustrating a contact layer thin film forming process in the method for fabricating the thin-film semiconductor device according to the embodiment.

DESCRIPTION OF EMBODIMENT(S)

Figure 1:
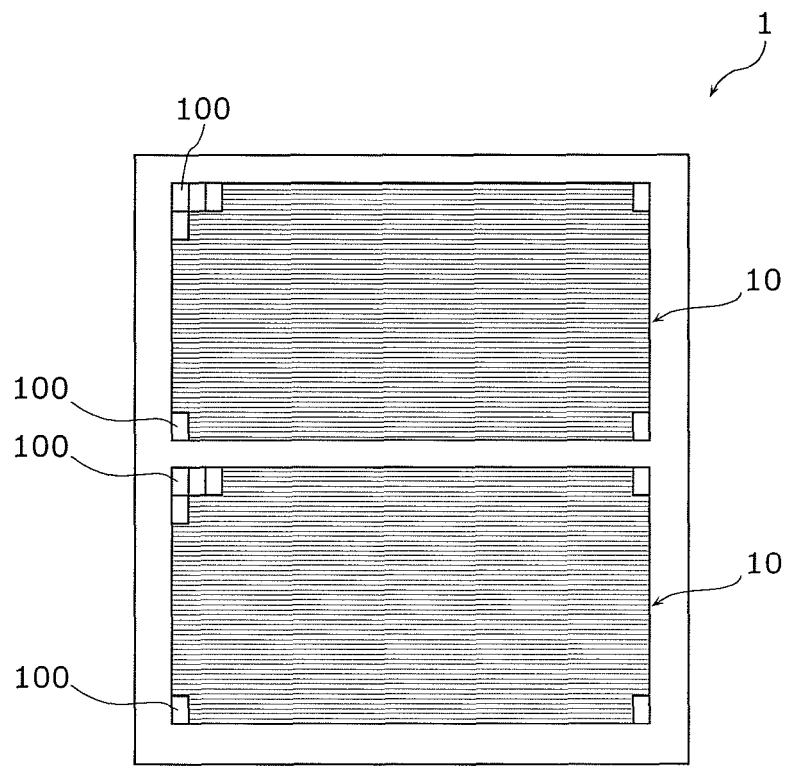
FIG. 1 illustrates a thin-film semiconductor array substrate.

In one general aspect, the thin-film semiconductor device disclosed here feature a substrate; and a semiconductor device part and a capacitor part which are above the substrate and apart from each other. The semiconductor device part includes: a light-shielding gate electrode above the substrate; a first insulating layer above the gate electrode; a semiconductor layer above the first insulating layer; a second insulating layer above the semiconductor layer; and a source electrode and a drain electrode that are above the second insulating layer. The capacitor part includes: a first capacitor electrode including a light-transmitting conductive material above the substrate; a dielectric layer including a same material as the first insulating layer, above the first capacitor electrode; and a second capacitor electrode above the dielectric layer, including a conductive material same as at least one of the source electrode and the drain electrode. The second gate electrode, the semiconductor layer, and the second insulating layer have outlines that are coincident with one another in a top view.

With this configuration, the outlines of the gate electrode and the channel protective layer coincide with each other in a top view. As a result, the gate electrode, the source electrode, and the drain electrode do not overlap one another in regions on the left and right of the channel protective layer. Accordingly, parasitic capacitance in the regions can be reduced. Furthermore, since the semiconductor layer is not disposed between the first capacitor electrode and the second capacitor electrode, an MIM capacitor part can be formed.

For example, the gate electrode includes a first gate electrode including a light-transmitting conductive material and a second gate electrode including a light-shielding conductive material.

The semiconductor device part may further include a pair of contact layers each of which is between the second insulating layer and the source electrode or between the second insulating layer and the drain electrode, and is contacting a side surface of the semiconductor layer.

The capacitor part may further include an intermediate layer including a same material as the contact layer, between the dielectric layer and the second capacitor electrode.

The semiconductor layer may include a crystalline silicon thin film.

The semiconductor layer may further include an intrinsic non-crystalline silicon thin film above the crystalline silicon thin film.

The second gate electrode, the crystalline silicon thin film, the intrinsic non-crystalline silicon thin film, and the second insulating layer having outlines that are coincident with one another in a top view may be stacked.

The second insulating layer may include an organic material.

In one general aspect, the method for fabricating the thin-film semiconductor device disclosed here feature preparing a substrate; forming, above the substrate, a gate electrode including a light-shielding conductive material and a first capacitor electrode including a light-transmitting conductive material apart from the gate electrode; forming a first insulating layer above the gate electrode and the first capacitor electrode; forming a semiconductor layer above the first insulating layer; forming a second insulating layer above the semiconductor layer; exposing the second insulating layer to light from a side of a surface of the substrate on the other side of a surface on which the first gate electrode is formed, using the second gate electrode as a mask for the second insulating layer; removing the second insulating layer in a position not overlapping with the second gate electrode by developing the second insulating layer such that the second insulating layer at a position overlapping with the second gate insulating layer remains; etching the semiconductor layer using the remaining second insulating layer as a mask; and forming a source electrode and a drain electrode that are electrically connected to the semiconductor layer and forming a second capacitor electrode above the first insulating layer at a position overlapping at least part of the first capacitor electrode in a top view.

As described above, the outline of the second insulating layer is self-aligned to have the outline coinciding with the outline of the gate electrode by forming the gate electrode with the light-shielding conductive material and exposing the second insulating layer from the back surface side of the substrate. Furthermore, it is possible to remove the semiconductor layer between the first and second capacitor electrodes by etching the semiconductor layer using the second insulating layer as a mask. With this method, it is possible to obtain the thin-film semiconductor device relatively easily.

The gate electrode may include a first gate electrode and a second gate electrode formed above the first gate electrode. The first gate electrode and the first capacitor electrode may be simultaneously formed above the substrate, and the second gate electrode including a light-shielding conductive material may be formed above the first gate electrode.

The semiconductor layer may have a thickness allowing the light to pass through the semiconductor layer.

The semiconductor layer may have the thickness in a range from approximately 30 nm to approximately 200 nm.

The semiconductor layer may be formed by stacking a crystalline silicon layer and a non-crystalline silicon layer. The non-crystalline silicon layer may have a thickness smaller than or equal to 50 nm.

Since the intrinsic non-crystalline silicon thin film has high absorptance of the light in the exposure process. If the intrinsic non-crystalline silicon thin film is too thick, the necessary amount of exposure does not reach the second insulating layer, making the exposure insufficient. There is also another possibility that the exposure for a long time would be necessary to obtain necessary amount of exposure, which could result in significantly degraded productivity. However, if the amount of light used for the exposure process is increased, the thickness of the intrinsic non-crystalline silicon thin film may be greater than or equal to 50 nm.

The gate electrode may include a first gate electrode including a light-transmitting conductive material formed collectively with the first capacitor electrode and a second gate electrode comprising a light-shielding conductive material above the first gate electrode. The first gate electrode, the second gate electrode, and the first capacitor electrode may be simultaneously formed using a half tone mask.

With this configuration, the first gate electrode, the second gate electrode, and the first capacitor electrode may be formed in one process.

The following shall describe a thin-film semiconductor device and the method for fabricating the thin-film semiconductor device according to the present disclosure with reference to the drawings. Note that, the present disclosure is defined based on the recitations in Claims. Accordingly, among components in the embodiment, the components not recited in Claims are not necessary for solving the problem, but composes a more preferable embodiment. Note that, the diagrams are schematic diagrams, and the illustration is not always strictly accurate.

Embodiment

Figure 2:
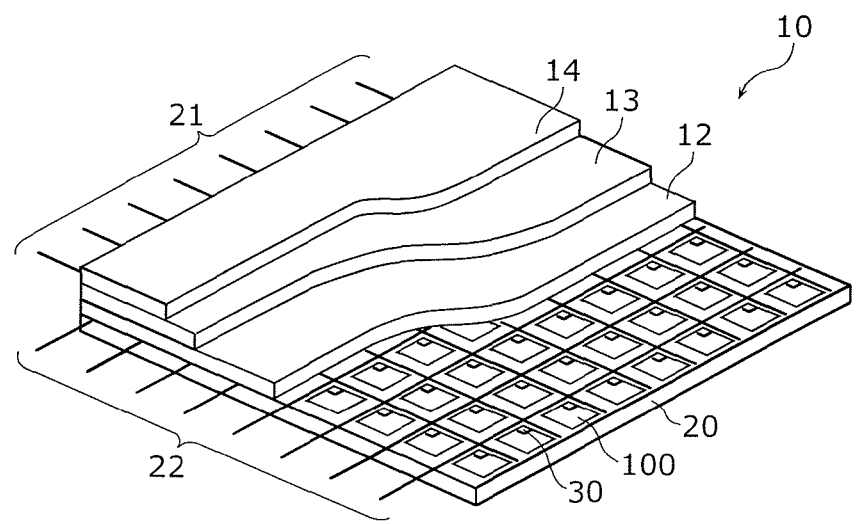
FIG. 2 is a perspective view of an organic EL display according to the embodiment.

An organic electroluminescence (EL) display (organic EL display panel) 10 and a thin-film transistor array device for image display device 20 (hereafter simply referred to as a thin-film transistor array device) 20 according to the present disclosure shall be described with reference to FIG. 1 and FIG. 2. Note that, FIG. 1 illustrates a thin-film semiconductor array substrate 1. FIG. 2 is a perspective view of the organic EL display 10 which is an example of the display device according to the embodiment.

First, as illustrated in FIG. 1, the thin-film semiconductor array substrate 1 includes a plurality of (two in FIG. 1) the organic EL displays 10. As illustrated in FIG. 2, the organic EL display 10 is a stacked structure of the thin-film transistor array device 20, the interlayer insulating film (planarizing film) 11 (not illustrated in FIG. 2), an anode (lower electrode) 12, an organic EL layer (organic light-emitting layer) 13, and a transparent cathode (upper electrode) 14. In addition, a hole transport layer (not illustrated) is stacked between the anode 12 and the organic EL layer 13, and an electron transport layer (not illustrated) is stacked between the organic EL layer 13 and the transparent cathode 14.

In the thin-film transistor array device 20, pixels 100 are arranged in rows and columns (in a matrix). The pixels 100 are driven by pixel circuits 30 each provided for one of the pixels 100. The thin-film transistor array device 20 further includes gate lines 21 arranged in rows, source lines (signal lines) 22 arranged in columns crossing the gate lines 21, and power lines 23 (not illustrated in FIG. 2) extending parallel to the source lines 22.

The gate lines 21 connect, for each row, gate electrodes 41 of the thin-film transistors in the pixel circuits 30, each operating as a switching device (not illustrated in FIG. 2). The source lines 22 connect, for each row, source electrodes 42 of the thin-film transistors in the pixel circuits 30, each operating as a switching device (not illustrated in FIG. 2). The power supply lines 23 connect, for each column, drain electrodes 52 of the thin-film transistors in the pixel circuits 30, each operating as a driving device (not illustrated in FIG. 2).

Figure 3:
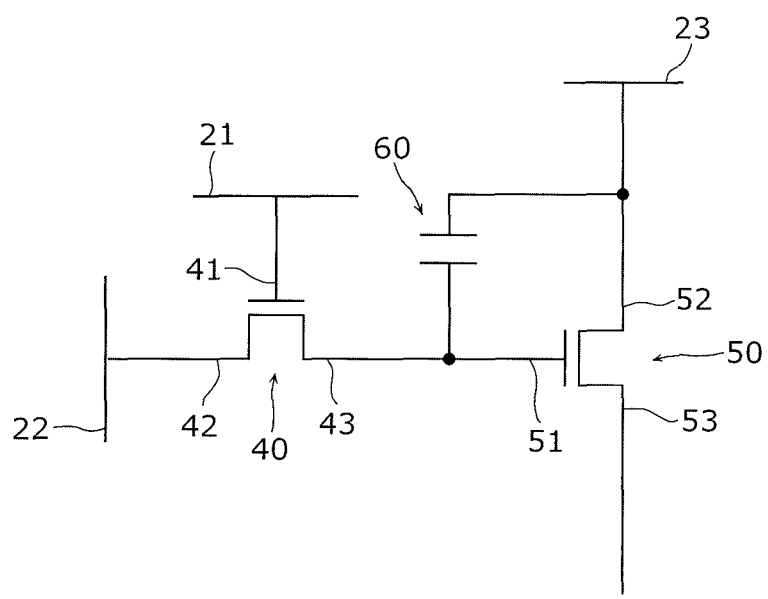
FIG. 3 illustrates a circuit configuration of a pixel circuit.
Figure 4:
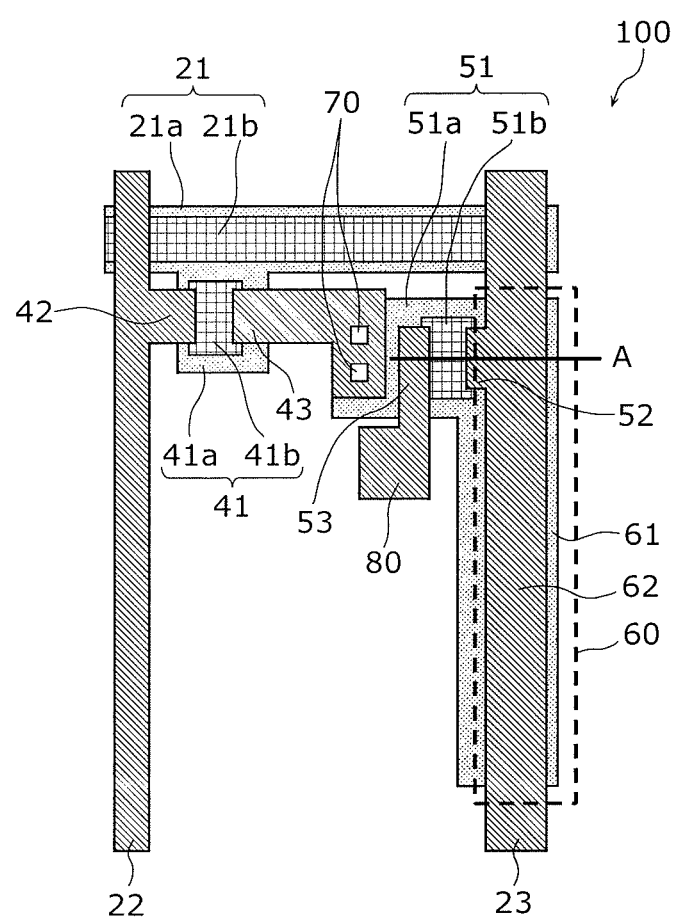
FIG. 4 is a plan view illustrating a configuration of a thin-film semiconductor device according to the embodiment.

Next, the configuration of the pixel 100 shall be described with reference to FIG. 3 and FIG. 4. Note that, FIG. 3 is a circuit diagram of the pixel circuit 30 included in the pixel 100. FIG. 4 is a plan view illustrating the configuration of the pixel 100.

As illustrated in FIG. 3, the pixel circuit 30 includes a first transistor 40 which operates as the switching device, a second transistor 50 which operates as the driving device, and a capacitor 60 in which data to be displayed on a corresponding pixel is stored.

The first transistor 40 includes a gate electrode 41 connected to the gate line 21, a source electrode 42 connected to the source line 22, and a drain electrode 43 connected to a capacitor 60 and a gate electrode 51 of the second transistor 50. With the first transistor 40, when voltage is applied on the gate line 21 and the source line 22 that are connected, the capacitor 60 stores a voltage value applied on the source line 22 as display data.

The second transistor 50 includes a gate electrode 51, a drain electrode 52 connected to the power supply line 23 and the capacitor 60, and a source electrode 53. The second transistor 50 supplies current corresponding to the voltage value held by the capacitor 60 to the anode 12 from the power supply line 23 through the source electrode 53.

More specifically, the organic EL display 10 with the configuration described above is an active-matrix display in which display control is performed on each of the pixels 100 provided at crosspoints of the gate lines 21 and the source lines 22.

Note that, as illustrated in FIG. 4, the drain electrode 43 in the first transistor 40 and the gate electrode 51 in the second transistor 50 are electrically connected through contact holes 70. The source electrode 53 in the second transistor is electrically connected the anode 12 (not illustrated in FIG. 4) through a relay electrode 80.

As illustrated in FIG. 4, the gate line 21 and the gate electrodes 41 and 51 are formed by stacking two kinds of metal. More specifically, the gate line 21 is formed by stacking a first gate line 21a and a second gate line 21b. The gate electrode 41 is formed by stacking a first gate electrode 41a and a second gate electrode 41b. The gate electrode 51 is formed by stacking a first gate electrode 51a and a second gate electrode 51b.

Figure 5:
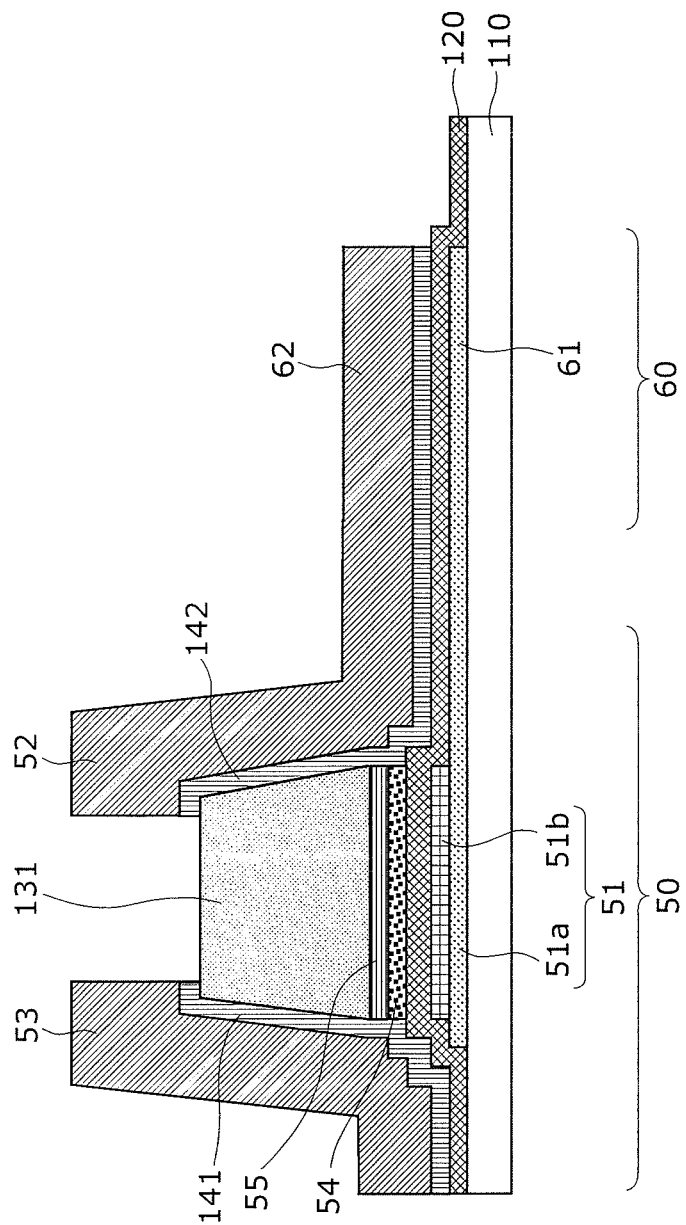
FIG. 5 is a cross-sectional view along the line A in FIG. 4.

Next, detailed configurations of the second transistor 50 and the capacitor 60 shall be described with reference to FIG. 5 and FIG. 6A to FIG. 6D. FIG. 5 is a cross-sectional view along the line A in FIG. 4. FIG. 6A to FIG. 6D illustrate positional relationship between the elements in the pixel 100 in a top view. Note that, the configuration of the first transistor 40 is common to the second transistor 50. Accordingly, the description focuses on the second transistor 50.

First, as illustrated in FIG. 5, the second transistor (semiconductor device part) 50 and the capacitor (capacitor part) 60 are formed above a common substrate 110 and apart from each other. The second transistor 50 is a bottom-gate thin-film transistor formed by stacking the gate electrode 51, a gate insulating film (first insulating layer) 120, a crystalline silicon layer 54, a non-crystalline silicon layer 55, a channel protective layer 131, a pair of contact layers 141 and 142, the source electrode 53 and the drain electrode 52 in order above the substrate 110. The capacitor 60 is formed by stacking the first capacitor electrode 61, the gate insulating film 120 that serves as the dielectric layer, a silicon layer 143, and the second capacitor electrode 62 in order above the substrate 110.

The substrate 110 is a glass substrate made of, for example, a glass material such as silica glass, alkali-free glass, or highly heat-resistant glass. An undercoat layer made of a silicon nitride ($SiN_x$) film, a silicon oxide ($SiO_y$) film, a silicon oxynitride ($SiO_yN_x$) film, or others may be formed on the substrate 110 in order to prevent impurity such as sodium and phosphorus in the glass substrate from entering the crystalline silicon thin layer 54. In addition, the undercoat layer may also function as a layer for buffering the heat on the substrate 110 in a high-temperature thermal treatment process such as laser annealing. The thickness of the undercoat layer is, for example, approximately 100 nm to 2000 nm.

The gate electrode 51 and the first capacitor electrode 61 are patterned above the substrate 110 in a predetermined shape. More specifically, the gate electrode 51 is a stacked structure of the first gate electrode 51a patterned above the substrate 110 and the second gate electrode 51b patterned on the first gate electrode 51a. The first capacitor electrode 61 is formed of the same material as the first gate electrode 51a, and is patterned above the substrate 110.

Figure 6A:
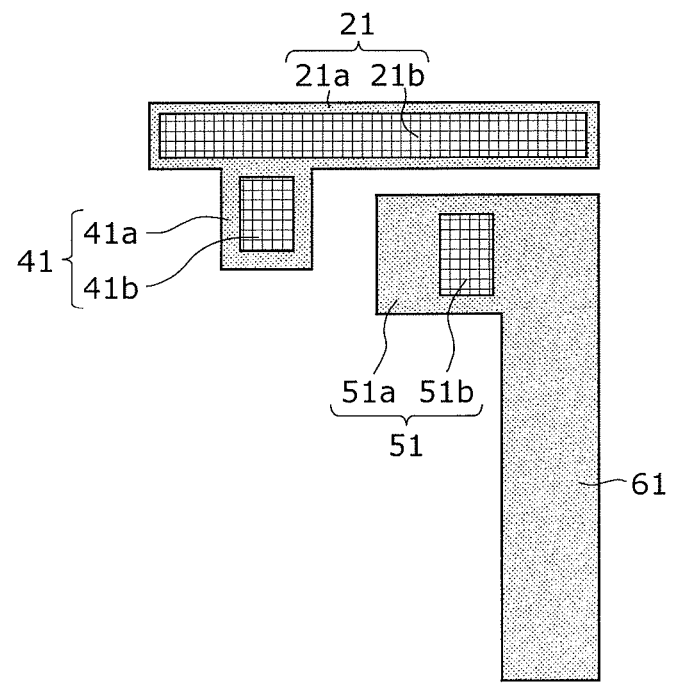
FIG. 6A illustrates a positional relationship of components in a gate line layer.

As illustrated in FIG. 6A, in this embodiment, the first gate line 21a and the first gate electrode 41a of the first transistor 40 are formed as a single continuous pattern, and the first gate electrode 51a of the second transistor 50 and the first capacitor electrode 61 are formed as a single continuous pattern. Subsequently, the second gate line 21b, the second gate electrode 41b, and the second gate electrode 51b are formed as individual patterns. The second gate line 21b is formed on the first gate line 21a, the second gate electrode 41b is formed on the first gate electrode 41a of the first transistor 40, and the second gate electrode 51b is formed on the first gate electrode 51a of the second transistor 50.

The first gate electrode 51a and the first capacitor electrode 61 are formed of a transparent conductive material. Although a specific example of the transparent conductive material is not particularly limited, indium tin oxide (ITO), $SnO_2$, $In_2O_3$, ZnO, and others may be used.

In contrast, the second gate electrode 51b is formed of a light-shielding conductive material. Although the specific example of the light-shielding conductive material is not particularly limited, for example, molybdenum (Mo), aluminum (Al), copper (Cu), tungsten (W), titanium (Ti), chromium (Cr), and molybdenum-tungsten (MoW) may be used. The thickness of the gate electrode 51 may be approximately 20 to 500 nm, for example.

The gate insulating film (first insulating layer) 120 is formed on the entire surface of the substrate 110 so as to cover the gate electrode 51 and the first capacitor electrode 61. More specifically, the gate insulating film 120 serves as the gate insulating film in the region of the second transistor 50, and serves as the dielectric layer in the region of the capacitor 60.

The gate insulating film 120 is made of, for example, a single-layer film of silicon oxide ($SiO_y$), silicon nitride ($SiN_x$), a silicon oxynitride ($SiO_yN_x$), aluminum oxide ($AlO_z$), or tantalum oxide ($TaO_w$), or a stacked film of the materials. The thickness of the gate insulating film 120 is, for example, 50 nm to 300 nm.

Note that, in this embodiment, since the channel region of the second transistor 50 is formed in the crystalline silicon layer 54, silicon oxide is used as the gate insulating film 120, for example. Silicon oxide is suitable for achieving satisfactory interface state between the crystalline silicon layer 54 and the gate insulating film 120, which improves the threshold voltage characteristics of the second transistor 50.

The crystalline silicon layer (channel layer) 54 is a semiconductor film patterned in a position overlapping with the gate electrode 51 on the gate insulating film 120, and has a predetermined channel region which is a region in which carrier movement is controlled by the voltage at the gate electrode 51. The channel length of the second transistor 50 is defined as the width of the channel protective layer 131.

Figure 6B:
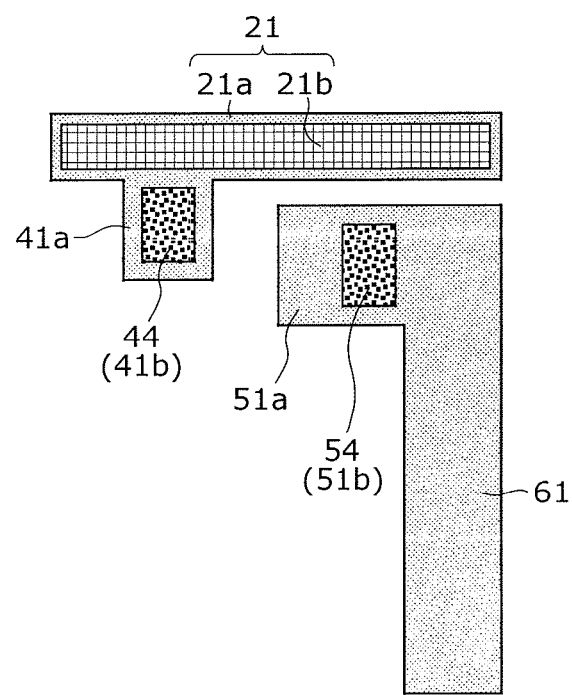
FIG. 6B illustrates a positional relationship between a second gate electrode and a crystalline silicon layer.

In this embodiment, the second gate electrode 51b of the second transistor 50 and the crystalline silicon layer 54 are stacked such that the outlines coincide with each other in a top view, as illustrated in FIG. 6B. Here, "the outlines coincide with each other" refers to a state in which the second gate electrode 51b and the crystalline silicon layer 54 have the same shape (same shape and same area), and the second gate electrode 51b and the crystalline silicon layer 54 are provided without misplaced from each other in the horizontal direction. Similarly, the second gate electrode 41b of the first transistor 40 and the crystalline silicon layer 44 are stacked such that the outlines coincide with each other in a top view.

The crystalline silicon layer 54 is a crystalline silicon thin film having a crystalline structure, and is made of a microcrystalline silicon thin film or a polysilicon thin film. The crystalline silicon layer 54 is formed by crystallizing a non-crystalline amorphous silicon, for example. The crystalline silicon semiconductor layer 54 may be formed as a mixed crystal structure of amorphous silicon and crystalline silicon. In this case, in order to achieve excellent turn-on characteristics, at least the channel region is formed of a film having a high ratio of crystalline silicon, for example. The thickness of a layer including the crystalline silicon layer 54 and the amorphous silicon layer 55 is, for example, approximately 30 nm to 200 nm (a thickness which allows exposure of light from the back surface to pass through, which is to be described later). Note that, the orientation of the principal plane of the silicon crystals in the crystalline silicon layer 54 is [100], for example. With this, it is possible to form a crystalline silicon layer 54 having excellent crystallinity.

Note that, the average crystal grain size of the crystalline silicon in the crystalline silicon layer 54 is approximately 5 nm to 1000 nm. In the crystalline silicon layer 54, polycrystals having an average grain size greater than or equal to 100 nm, or microcrystals (μc) having an average grain size of 10 nm to 100 nm are included.

Figure 6C:
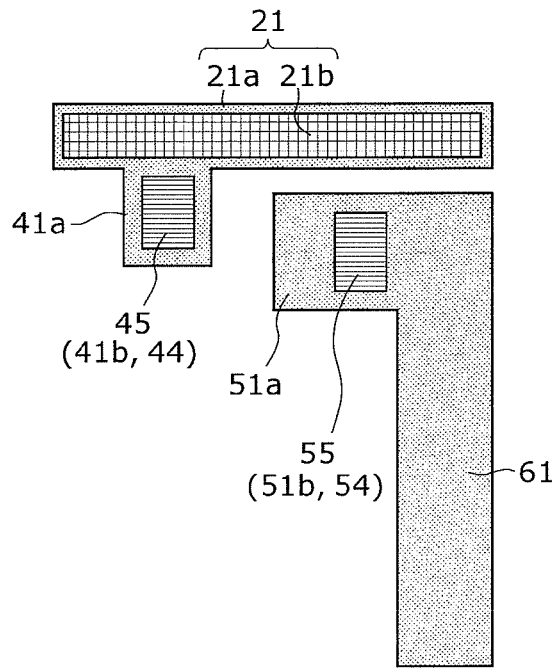
FIG. 6C illustrates a positional relationship between the second gate electrode, the crystalline silicon layer, and a non-crystalline silicon layer.

The amorphous silicon layer (back channel layer) 55 is patterned on the crystalline silicon layer 54. In this embodiment, the second gate electrode 51b of the second transistor 50, the crystalline silicon layer 54, and the non-crystalline silicon layer 55 are stacked such that the outlines coincide with each other in a top view, as illustrated in FIG. 6C. Similarly, the second gate electrode 41b of the first transistor 40, the crystalline silicon layer 44, and the non-crystalline silicon layer 45 are stacked such that the outlines coincide with each other in a top view.

The non-crystalline silicon layer 55 is formed of an amorphous silicon film (intrinsic amorphous silicon) which is intentionally not doped with impurity, for example. The non-crystalline silicon layer 55 has a higher density of localized states (trap density) than the crystalline silicon layer 54. More specifically, the electric field can be shielded by cancelling positive fixed charge in the channel protective layer 131 by the charge density of the negative carriers in the non-crystalline silicon layer 55. With this, it is possible to suppress formation of a back channel, suppressing the leakage current when the second transistor 50 is turned off. Accordingly, the off-characteristics of the second transistor 50 are improved. Note that, the thickness of the non-crystalline silicon layer 55 is smaller than or equal to 50 nm, for example.

Figure 6D:
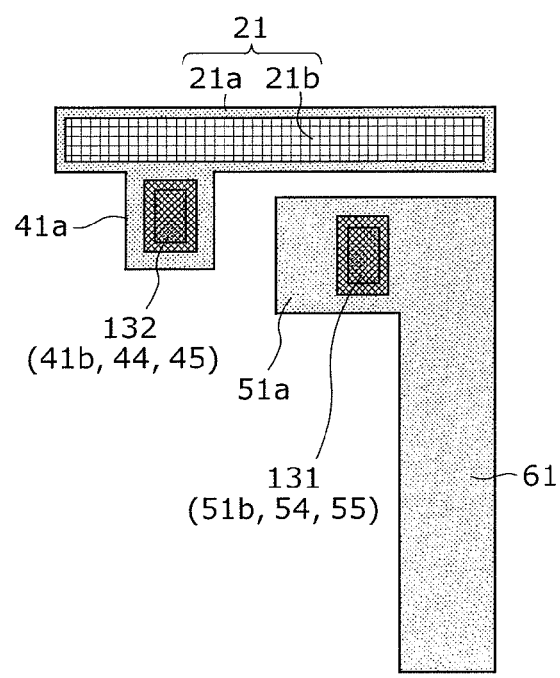
FIG. 6D illustrates a positional relationship between the second gate electrode, the crystalline silicon layer, a non-crystalline silicon layer, and a channel-protective layer.

The channel protective layer (second insulating layer) 131 is patterned at a position overlapping with the channel region on the non-crystalline silicon layer 55. As illustrated in FIG. 6D, the second gate electrode 51b of the second transistor 50, the crystalline silicon layer 54, the non-crystalline silicon layer 55, and the channel protective layer 131 are stacked such that the outlines coincide with each other in a top view, in this embodiment. Similarly, the second gate electrode 41b of the first transistor 40, the crystalline silicon layer 44, the non-crystalline silicon layer 45, and the channel protective layer 131 are stacked such that the outlines coincide with each other in a top view.

In this embodiment, the channel protective layer 131 functions as a channel etching stopper (CES) layer for protecting the semiconductor layer including the channel region (the crystalline silicon layer 54 and the non-crystalline silicon layer 55). More specifically, the channel protective layer 131 has a function of preventing the crystalline silicon layer 54 and the non-crystalline silicon layer 55 from being etched during the etching process for forming the pair of the contact layers 141 and 142.

As a material for forming the channel protective layer 131, an organic material mainly containing silicon, oxygen, and carbon is used, for example. The channel protective layer 131 according to the embodiment can be formed by patterning and solidifying a photosensitive application type organic material.

The organic material for forming the channel protective layer 131 includes, for example, an organic resin material, a surface activating agent, a solvent, and a photosensitizing agent. As the organic resin material, photosensitive or non-photosensitive organic resin material made of one or more of polyimide, acrylic, polyamide, polyimide-amide, resist, and benzocyclobutene may be used. As the surface activating agent, a surface activating agent made of a silicon compound such as siloxane may be used. As the solvent, an organic solvent such as propyleneglycol monomethylether acetate or 1,4-dioxane may be used. As the photosensitizing agent, a positive photosensitizing agent such as naphthoquinone diazide may be used. Note that, the photosensitizing agent includes not only carbon, but also sulfur.

When forming the channel protective layer 131, the organic material may be formed by a coating method such as the spin coating. In addition to the coating method, the channel protective layer 131 may be formed by a method such as the liquid drop ejection method. An organic material may be selectively formed in a predetermined shape by using a printing method such as the screen printing or the offset printing which allow formation of the predetermined pattern.

The thickness of the channel protective layer 131 is 300 nm to 1000 nm, for example. The minimum thickness of the channel protective layer 131 is determined in consideration of a margin for channel etching and aiming for suppressing the influence of the fixed potential in the channel protective layer 131. The maximum thickness of the channel protective layer 131 is determined for suppressing the reduction in the reliability of process due to an increase in the thickness of a step between (i) the channel protective layer 131 and (ii) the contact layers 141 and 142, the source electrode 53, or the drain electrode 52.

The pair of the contact layers 141 and 142 is provided to cover the channel protective layer 131, the non-crystalline silicon layer 55, and the crystalline silicon layer 54. The contact layer 141 and the contact layer 142 are provided opposite to each other with a predetermined interval. The contact layer 142 extends to a position in which the capacitor 60 is formed.

More specifically, the contact layer 141 is formed across a part of the upper surface of the channel protective layer 131, a side surface on one side (left side in FIG. 5) of the channel protective layer 131, a side surface of on one side (left side in FIG. 5) of the non-crystalline silicon layer 55, and a side surface on one side (left side in FIG. 5) of the crystalline silicon layer 54. The contact layer 141 contacts the side surface on the one side of the crystalline silicon layer 54.

The contact layer 142 is formed across a part of the upper surface of the channel protective layer 131, a side surface on the other side (right side in FIG. 5) of the channel protective layer 131, a side surface of on the other side (right side in FIG.

5) of the non-crystalline silicon layer 55, and a side surface on the other side (right side in FIG. 5) of the crystalline silicon layer 54, and is extended on the gate insulating layer 120 to a position of the capacitor 60. The contact layer 142 contacts the side surface on the other side of the crystalline silicon layer 54.

The contact layers 141 and 142 are amorphous semiconductor films containing impurity at high concentration, and are n+ layers each including a high concentration of impurity at least $1\times10^{19}$ (atm/cm$^3$). More specifically, the contact layers 141 and 142 are n-type semiconductor film formed by doping amorphous silicon with phosphorus (P) as the impurity. The thickness of the contact layer 141 and 142 is 5 nm to 100 nm, for example.

Note that, each of the contract layers 141 and 142 may be formed of two layers; namely, a lower low-concentration field limiting layer (n− layer) and an upper high-concentration contact layer (n+ layer). The low-concentration field limiting layer is doped with phosphorus at approximately $1\times10^{17}$ (atm/cm$^3$). The two layers may be continuously formed by a chemical vapor deposition (CVD) apparatus.

The source electrode 53 and the drain electrode 52 are patterned at positions overlapping with the contact layers 141 and 142, and the channel region above the gate insulating film 120. The source electrode 53 and the drain electrode 52 are disposed opposite to each other with a predetermined interval.

More specifically, the source electrode 53 is formed above the contract layer 141 across a part of the upper surface of the channel protective layer 131, a side surface of the channel protective layer 131 on one side, a side surface of the non-crystalline silicon layer 55 on one side, and a side surface of the crystalline silicon layer 54 on one side. Similarly, the drain electrode 52 is formed above the contact layer 142 across a part of the upper surface of the channel protective layer 131, a side surface of the channel protective layer 131 on the other side, a side surface of the non-crystalline silicon layer 55 on the other side, a side surface of the crystalline silicon layer 54 on the other side, and the capacitor 60. Note that, the part of the drain electrode 52 overlapping with the first capacitor electrode 61 serves as the second capacitor electrode 62.

The second capacitor electrode 62 is formed of the same material as at least one of the source electrode 53 and the drain electrode 52, and is formed above the contract layer 142 at a position overlapping with the first capacitor electrode 61. Note that, in this embodiment, a part of the power supply line 23 serves as the second capacitor electrode 62, as illustrated in FIG. 4.

In this embodiment, each of the source electrode 53, the drain electrode 52, and the second capacitor electrode 62 may be a single-layer structure or multilayer structure that is made of a conductive material, an alloy including the material, or the like. For example, the source electrode 53, the drain electrode 52, and the second capacitor electrode 62 are made of aluminum (Al), molybdenum (Mo), tungsten (W), copper (Cu), titanium (Ti), and chromium (Cr). In this embodiment, the source electrode 53, the drain electrode 52, and the second capacitor electrode 62 are formed as a tri-layer structure of MoW/Al/MoW, for example. The thickness of the source electrode 53, the drain electrode 52, and the second capacitor electrode 62 is, for example, approximately 100 nm to 500 nm.

In the second transistor 50 with the configuration described above, as illustrated in FIG. 6A to FIG. 6D, the second gate electrode 51b and the channel protective layer 131 have the outlines that are coincident with each other in a top view. With this, in the cross-section illustrated in FIG. 5, the lateral end portions on the lower surface of the channel protective layer 131 are positioned on lines extended from the lateral side surfaces of the second gate electrode 51b. As a result, the gate electrode 51, the source electrode 53, and the drain electrode 52 do not overlap one another in regions on the left and right of the channel protective layer 131. Accordingly, parasitic capacitance in this region can be reduced. Note that, the channel protective layer 131 illustrated in FIG. 5 has a tapered shape having a smaller cross-sectional area from the lower surface toward the upper surface. Accordingly, at least the outline on the lower surface of the channel protective layer 131 coincides with the outlines of the second gate electrode 51b, the crystalline silicon layer 54, and the non-crystalline silicon layer 55.

Furthermore, in the capacitor 60 having the configuration described above, the only silicon layer provided between the first capacitor electrode 61 and the second capacitor electrode 62 is the contact layer 142. Since the presence of the contact layer 142 having the thickness of 5 nm to 100 nm barely affects the function of the capacitor 60, the capacitor 60 can be substantially considered as an MIM capacitor part.

Next, with reference to FIG. 7A to FIG. 7K, the method for fabricating the thin-film semiconductor device according to the embodiment shall be described. FIG. 7A to FIG. 7K are cross-sectional views schematically illustrating the process in the method for fabricating the thin-film transistor device according to the embodiment.

Figure 7A:
FIG. 7A is a cross-sectional view schematically illustrating substrate preparation process in the method for fabricating the thin-film semiconductor device according to the embodiment.

First, as illustrated in FIG. 7A, the substrate 110 is prepared. Note that, an undercoat layer made of a silicon nitride film, a silicon oxide film, a silicon oxynitride film or others may be formed on the substrate 110 by the plasma CVD or others, before the gate electrode 51 and the first capacitor electrode 61 are formed.

Next, as illustrated in FIG. 7B and FIG. 7C, the gate electrode 51 and the first capacitor electrode 61 in the predetermined shape are formed above the substrate 110. Here, a method of forming the first gate electrode 51a, the second gate electrode 51b, and the first capacitor electrode 61 simultaneously (with one process) shall be described. However, the process is not limited to this example, and the electrodes may be formed layer by layer.

First, as illustrated in FIG. 7B, a transparent conductive material 61M composing the first gate electrode 51a and the first capacitor electrode 61 is formed on the entire upper surface of the substrate 110 by sputtering. Next, a light-shielding conductive material 51M composing the second gate electrode 51b is formed on the entire region of the upper surface of the transparent conductive material 61M by sputtering.

Next, a mask 90 is formed on the light-shielding conductive material 51M by the photolithography. The mask 90 formed here is a half-tone mask having a relatively thick region in a part where both the transparent conductive material 61M and the light-shielding conductive material 51M are left and a relatively thin region in a part where only the transparent conductive material 61M is left.

The light-shielding conductive material 51M and the transparent conductive material 61M are patterned by the wet etching. With this, the gate electrode 51 and the first capacitor electrode 61 are formed in predetermined shapes, as illustrated in FIG. 7C. The wet etching may be performed using a chemical solution which is a mixture of trihydrogen phosphate ($H_3PO_4$), nitric acid ($HNO_3$), acetic acid ($CH_3COOH$) and water in a predetermined ratio, for example.

Figure 7D:
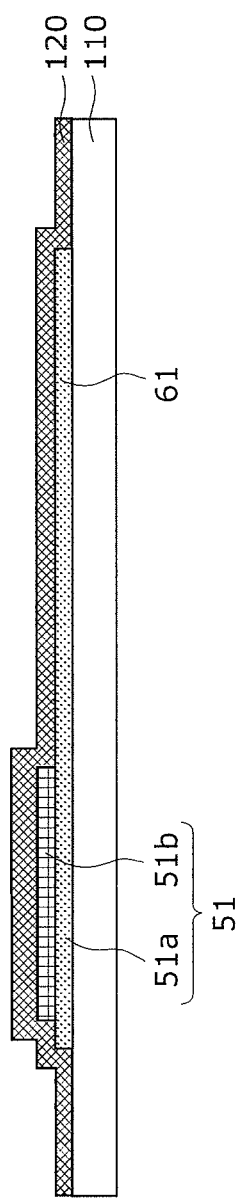
FIG. 7D is a cross-sectional view schematically illustrating a gate insulating film forming process in the method for fabricating the thin-film semiconductor device according to the embodiment.

Next, as illustrated in FIG. 7D, the gate insulating film 120 is formed on the entire upper surface of the substrate 110 so as to cover the gate electrode 51 and the first capacitor electrode 61. For example, the gate insulating film 120 made of silicon oxide is formed by the plasma CVD or others. Silicon oxide is formed, for example, by introducing silane gas ($SiH_4$) and nitrous oxide gas ($N_2O$) in a predetermined ratio of concentration, for example.

Next, as illustrated in FIG. 7E, the crystalline silicon thin film 54M to be the crystalline silicon layer 54 is formed on the entire upper surface of the gate insulating film 120. The crystalline silicon thin film 54M can be formed as follows: first, a non-crystalline silicon thin film made of amorphous silicon is deposited by the plasma CVD or others and a dehydrogenation annealing is performed; after that, the non-crystalline silicon thin film is annealed for crystallization. The non-crystalline silicon film is formed by introducing silane gas ($SiH_4$) and hydrogen gas ($H_2$) in a predetermined ratio of concentration, for example.

Note that, in this embodiment, the amorphous silicon thin film is crystallized by the laser annealing using the excimer laser. As the method for crystallization, the laser annealing using a pulse laser with a wavelength approximately 370 nm to 900 nm, the laser annealing using the continuous wave laser with a wavelength approximately 370 nm to 900 nm, or the annealing by the rapid thermal processing (RTP) may be used. Alternatively, the crystalline silicon thin film 54M may be formed by a method such as direct growth by the CVD, instead of crystallizing the non-crystalline silicon thin film.

Subsequently, by performing hydrogen plasma treatment on the crystalline silicon thin film 54M, silicon atoms in the crystalline silicon thin film 54M are hydrotreated. The hydrogen plasma treatment is performed by generating hydrogen plasma from gas containing hydrogen gas such as $H_2$, $H_2$/argon (Ar), using a radio frequency (RF) power, and by irradiating the polycrystalline semiconductor layer 54M with the hydrogen plasma. With the hydrogen plasma treatment, the dangling bond (defect) of silicon atoms are hydrogen terminated. As a result, the crystal defect density of the crystalline silicon thin film 54M is reduced, improving the crystallinity.

Figure 7F:
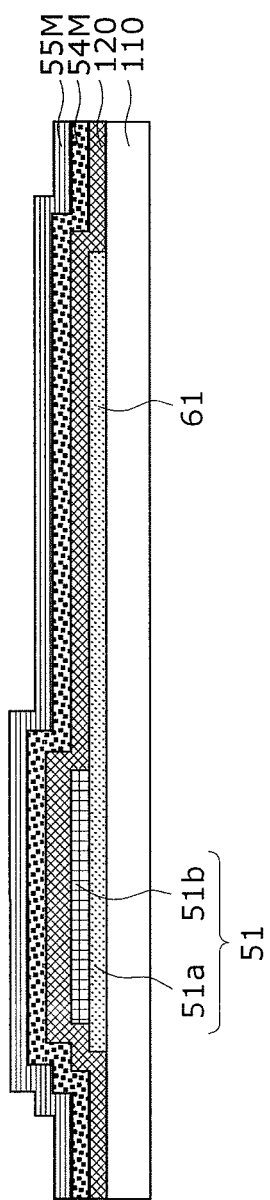
FIG. 7F is a cross-sectional view schematically illustrating a non-crystalline silicon thin film forming process in the method for fabricating the thin-film semiconductor device according to the embodiment.

Next, a non-crystalline silicon thin film 55M to be the non-crystalline silicon layer 55 is formed on the entire upper surface of the crystalline silicon thin film 54M, as illustrated in FIG. 7F. The non-crystalline silicon thin film 55M can be formed as follows: first, amorphous silicon is deposited by the plasma CVD or others; and a dehydrogenation annealing is performed.

The non-crystalline silicon thin film 55M has high absorptance of light used in an exposure process to be described later. Accordingly, if the non-crystalline silicon thin film 55M is too thick, there is a possibility that the exposure of the insulating film 131M would be insufficient. There is also another possibility that the exposure for a long time would be necessary to obtain necessary amount of exposure, which could result in significantly degraded productivity. In consideration of these possibilities, the thickness of the non-crystalline silicon thin film 55M is smaller than or equal to 50 nm, for example. However, if the amount of light used for the exposure process is increased, the thickness of the non-crystalline silicon thin film 55M may be greater than or equal to 50 nm.

Figure 7G:
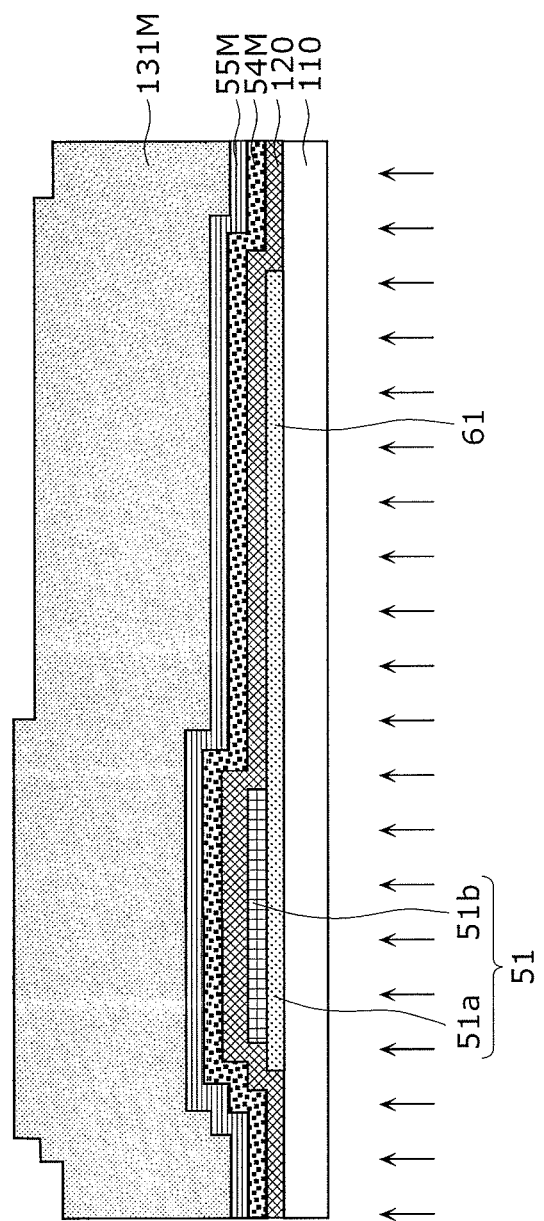
FIG. 7G is a cross-sectional view schematically illustrating an insulating film forming process in the method for fabricating the thin-film semiconductor device according to the embodiment.

Next, as illustrated in FIG. 7G, the insulating film 131M to be the channel protective layer 131 is formed on the entire upper surface of the non-crystalline silicon thin film 55M. More specifically, first, the organic material composing the channel protective layer 131 is applied on the upper surface of the non-crystalline silicon thin film 55M by a predetermined application method, and the insulating film 131M is formed on the entire upper surface of the non-crystalline silicon thin film 55M by the spin coating or the slit-coating. The thickness of the organic material may be controlled by the viscosity of the organic material and coating conditions (the number of rotations, the speed of blade, and others). Note that, as a material for the insulating film 131M, a photosensitive application type organic material containing silicon, oxygen, and carbon may be used.

Next, the insulating film 131M is prebaked for 60 seconds at the temperature of approximately 110° C. With this process, the solvent in the insulating film 131M evaporates. Subsequently, the insulating film 131M is exposed to light emitted from a side of the back surface of the substrate 110 (a surface on the opposite side of the surface on which the gate electrode 51 and the first capacitor electrode 61 are formed) using the second gate electrode 51*b* as a mask. Subsequently, the exposed insulating film 131M is patterned, forming the channel protective layer 131 in the predetermined shape in the region overlapping the second gate electrode 51*b* as illustrated in FIG. 7H.

Next, the patterned channel protective layer 131 is postbaked for approximately one hour at the temperature of 280° C. to 300° C. so as to solidify the channel protective layer 131. With this, a part of the organic component evaporates or decomposed, and the channel protective layer 131 with improved film quality is formed.

As described above, by exposing the insulating film 131M using the second gate electrode 51*b* formed of the lightshielding conductive material as a mask, the channel protective layer 131 is self-aligned such that the outlines of the second gate electrode 51*b* and the lower surface of the channel protective layer 131 coincide with each other. Accordingly, the second gate electrode 51*b*, the source electrode 53, and the drain electrode 52 do not overlap one another in regions on the left or right of the channel protective layer 131, thereby reducing the parasitic capacitance in the regions. In contrast, the first capacitor electrode 61 formed of the transparent conductive material transmits the exposure light. Accordingly, the insulating film 131M at a position on the capacitor 60 is removed.

Note that, in order to fabricate the thin-film semiconductor device with the configuration described above by the conventional fabrication method, it is necessary to perform a backsurface exposure for the self-alignment of the channel protective layer 131, and a front-surface exposure for removing the insulating film 131M at a position of the capacitor 60. In contrast, as illustrated in the embodiment, if the first capacitor electrode 61 is formed of the transparent conductive material, the thin-film semiconductor device can be fabricated by one back-surface exposure. Accordingly, the fabrication process is significantly reduced from the conventional technique.

Note that, when the insulating film 131M is patterned, the channel protective layer 131 becomes slightly smaller than the preferred size. To put it differently, the outline on the lower surface of the channel protective layer 131 is receded inside the outline of the upper surface of the gate electrode 51. In addition, the crystalline silicon layer 54 and the non-crystalline silicon layer 55 are formed by using the channel protective layer 131 as a mask, which is to be described layer. Accordingly, the outlines of the crystalline silicon layer 54 and the non-crystalline silicon layer 55 fall inside the outline of the second gate electrode 51*b*, in the same manner as the channel protective layer 131. In view of the above, in this Specification, an error within 0.5 μm in the fabrication process is included in a range of "outlines that are coincide with each other".

Figure 7I:
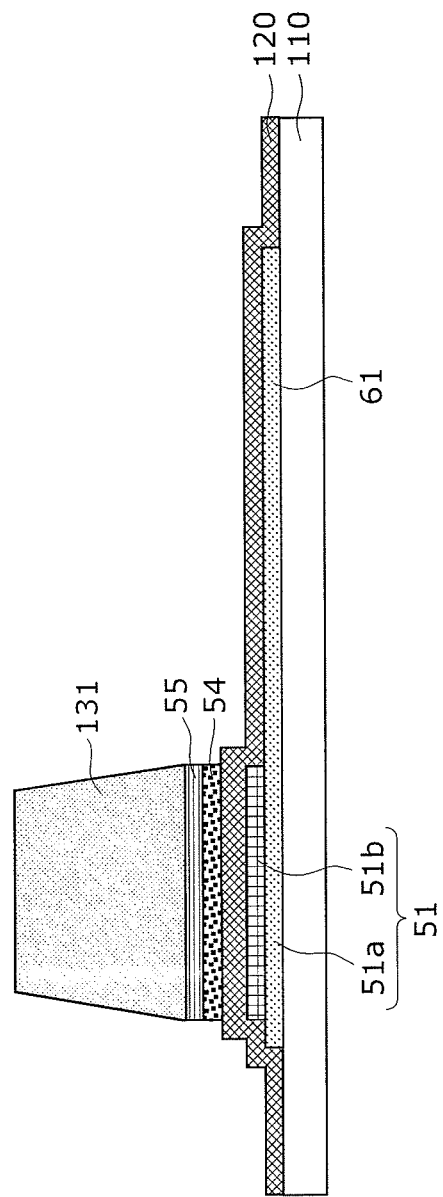
FIG. 7I is a cross-sectional view schematically illustrating a crystalline silicon layer/non-crystalline silicon layer forming process in the method for fabricating the thin-film semiconductor device according to the embodiment.

Next, dry etching on the crystalline silicon thin film 54M and the non-crystalline silicon 55M are performed using the channel protective layer 131 as a mask. With this, as illustrated in FIG. 7I, the crystalline silicon layer 54 and the amorphous silicon layer 55 are formed simultaneously at a position overlapping with the gate electrode 51.

By using the channel protective layer 131 as a mask, the outlines of the crystalline silicon layer 54 and the non-crystalline silicon layer 55 coincide with the outline on the lower surface of the channel protective layer 131. With this, it is possible for the contact layers 141 and 142 formed in the process to be described later to directly contract the side surfaces of the crystalline silicon layer 54. Consequently, the high-resistance non-crystalline silicon layer 55 is not included in a current path between the source electrode 53 and the crystalline silicon layer 54 or a current path between the drain electrode 52 and the crystalline silicon layer 54. Accordingly, it is possible to reduce the on-resistance. Furthermore, it is possible to remove the crystalline silicon thin film 54M and the non-crystalline silicon thin film 55M at a position of the capacitor 60.

Next, as illustrated in FIG. 7J, a contact layer thin film 141M to be the contact layers 141 and 142 is formed to cover the upper surface and the side surfaces of the channel protective layer 131, the side surfaces of the crystalline silicon layer 54 and the non-crystalline silicon layer 55, and the upper surface of the gate insulating film 120. For example, the contact layer thin film 141M made of an amorphous silicon film doped with an impurity of pentavalent element such as phosphorous (P) is formed by the plasma CVD.

Note that, the contract layer thin film 141M may be formed of two layers; namely, a lower low-concentration field limiting layer and an upper high-concentration contact layer. The low-concentration field limiting layer may be formed by doping phosphorus at approximately $1\times10^{17}$ (atm/cm$^3$). The two layers may be continuously formed by a CVD apparatus, for example.

Figure 7K:
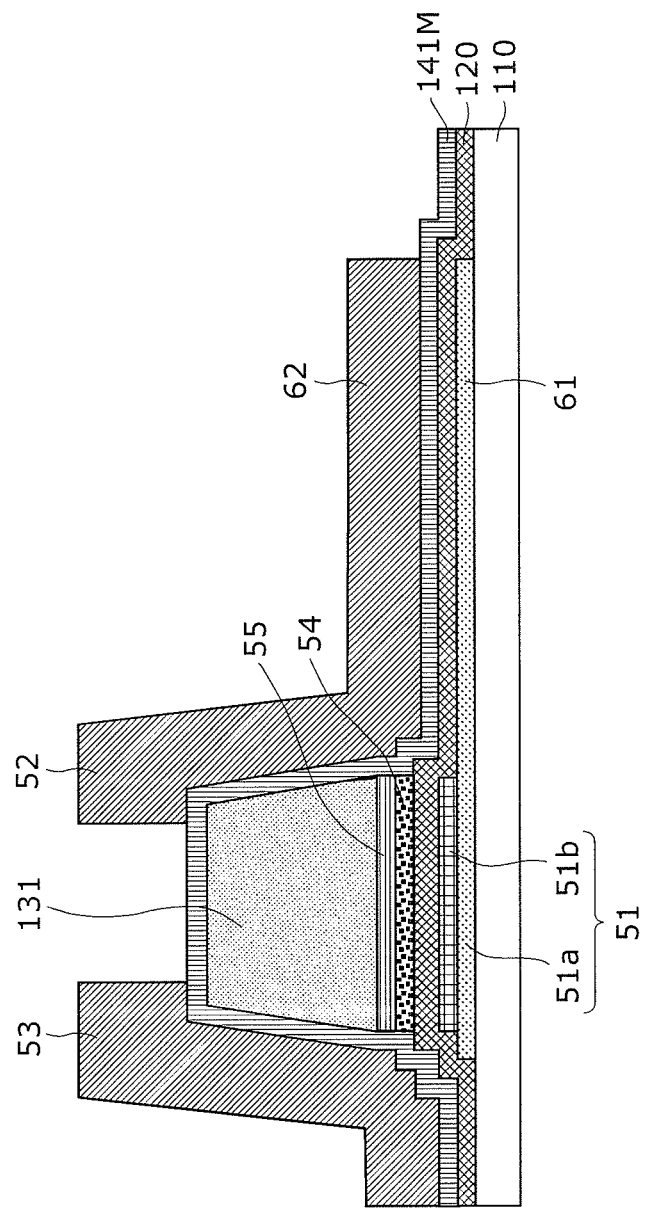
FIG. 7K is a cross-sectional view schematically illustrating a source electrode/drain electrode forming process in the method for fabricating the thin-film semiconductor device according to the embodiment.

Next, the source electrode 53, the drain electrode 52, and the second capacitor electrode 62 are patterned on the contact layer thin film 141M. In this case, first, a source-drain metal film to be the source electrode 53, the drain electrode 52, and the second capacitor electrode 62 are formed by sputtering, for example. Subsequently, a resist having a predetermined shape is patterned on the source-drain metal film, and the source-drain metal film is patterned by wet etching. Here, the contact layer thin film 141M serves as an etching stopper. Subsequently, the resist is removed, and the source electrode 53, the drain electrode 52, and the second capacitor electrode 62 having the predetermined shapes are formed, as illustrated in FIG. 7K.

Next, the contact layer thin film 141M is patterned by performing dry etching using the source electrode 53 and the drain electrode 52 as masks. Note that, chlorine gases may be used for the dry etching.

In this process, the pair of contact layers 141 and 142 is formed under the source electrode 53 and the drain electrode 52, respectively, and the silicon layer is formed under the second capacitor electrode 62. The thin-film semiconductor device according to the embodiment as illustrated in FIG. 5 is fabricated as described above.

Next, although not illustrated in the drawings, a method for fabricating an organic EL display 10 according to the embodiment shall be described. More specifically, a method for stacking an interlayer insulating film 11, a bank 15, an anode 12, an organic EL layer 13, and a transparent cathode 14 in order above the thin-film transistor array device 20 shall be described above.

First, the interlayer insulating film 11 is formed on the source electrode 53 and the drain electrode 52. Subsequently, by the photolithography and etching, a through hole passing through the interlayer insulating film 11 (not illustrated) is formed. The through hole subsequently becomes a contact hole (not illustrated) connecting the anode 12 and the relay electrode 80.

Next, the bank 15 is formed on the interlayer insulating film 11 at a position corresponding to the boundary of the pixels 100. The anode 12 is formed on the interlayer insulating film 11 in the opening of the bank 15 for each pixel 100. Here, the material composing the anode 12 is filled in the through hole, forming the contact hole. The anode 12 and the relay electrode 80 are electrically connected through the contact hole.

The anode 12 is made of, for example, a conductive metal such as molybdenum, aluminum, gold, silver, copper, and others, an alloy of the conductive metals, an organic conductive material such as PEDOT: PSS, zinc oxide, or lead-added indium oxide. The film made of the material is deposited by the vacuum vapor deposition, the electron beam deposition, the RF sputtering, or the printing method, and the electrode pattern is formed.

The organic EL layer 13 is formed on the anode 12 in the opening of the bank 15 for each pixel 100. The organic EL layer 13 is formed by stacking layers such as a hole injection layer, a hole transport layer, a light-emitting layer, an electron transport layer and an electron injection layer. For example, copper phthalocyanine may be used as the hole injection layer, α-NPD(Bis[N-(1-naphthyl)-N-phenyl]benzidine) may be used as the hole transport layer, Alq$_3$(tris-(8-hydroxyquinoline)aluminum) may be used as the light-emitting layer, oxazole derivative may be used as the electron transport layer, and Alq$_3$ may be used as the electron injection layer. Note that, these materials are merely examples, and other materials may be used.

The transparent cathode 14 is an electrode having a light-transmission property continuously formed on the organic EL layer 13. The transparent cathode 14 may be made of, for example, ITO, SnO$_2$, In$_2$O$_3$, ZnO, or a combination of these materials.

(Variation 1)

Figure 8:
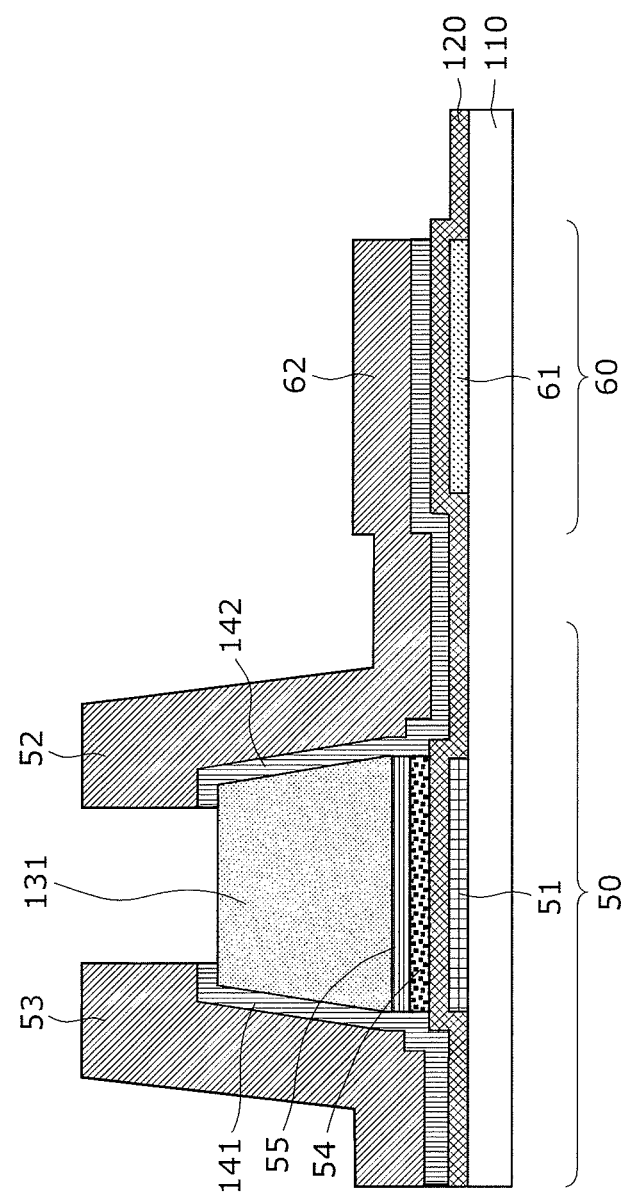
FIG. 8 is a cross-sectional view illustrating a configuration of the thin-film semiconductor device according to the variation 1.

Next, the variation 1 of the embodiment shall be described with reference to FIG. 8. FIG. 8 corresponds to FIG. 5. Note that, the description on similarity with the embodiment above is omitted and the description shall be made focusing on the difference.

A thin-film semiconductor device illustrated in FIG. 8 is different from the thin-film semiconductor device in FIG. 5 in that the gate electrode 51 of the second transistor 50 is made of the light-shielding conductive material only. The thin-film semiconductor device illustrated in FIG. 8 may be fabricated by patterning one of the gate electrode 51 and the first capacitor electrode 61 and patterning the other of the gate electrode 51 and the first capacitor electrode 61. Accordingly, although the fabrication process increases compared to the embodiment, a pattern corresponding to the first gate electrode 51a in FIG. 5 is not necessary. Therefore, it is possible to reduce the thickness of the second transistor 50.

(Variation 2)

Figure 9:
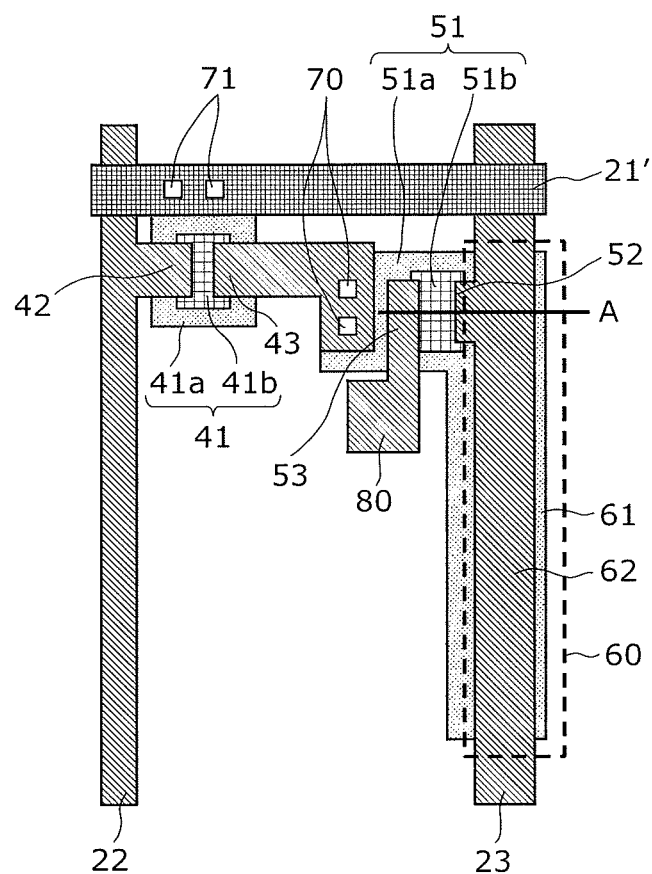
FIG. 9 is a plan view illustrating a configuration of the thin-film semiconductor device according to the variation 2.
Figure 10:
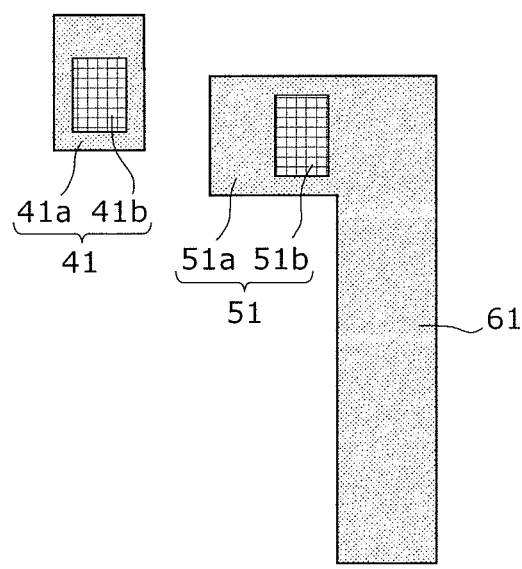
FIG. 10 illustrates a positional relationship between the elements in the gate line layer in the thin-film semiconductor device according to the variation 1.
Figure 11:
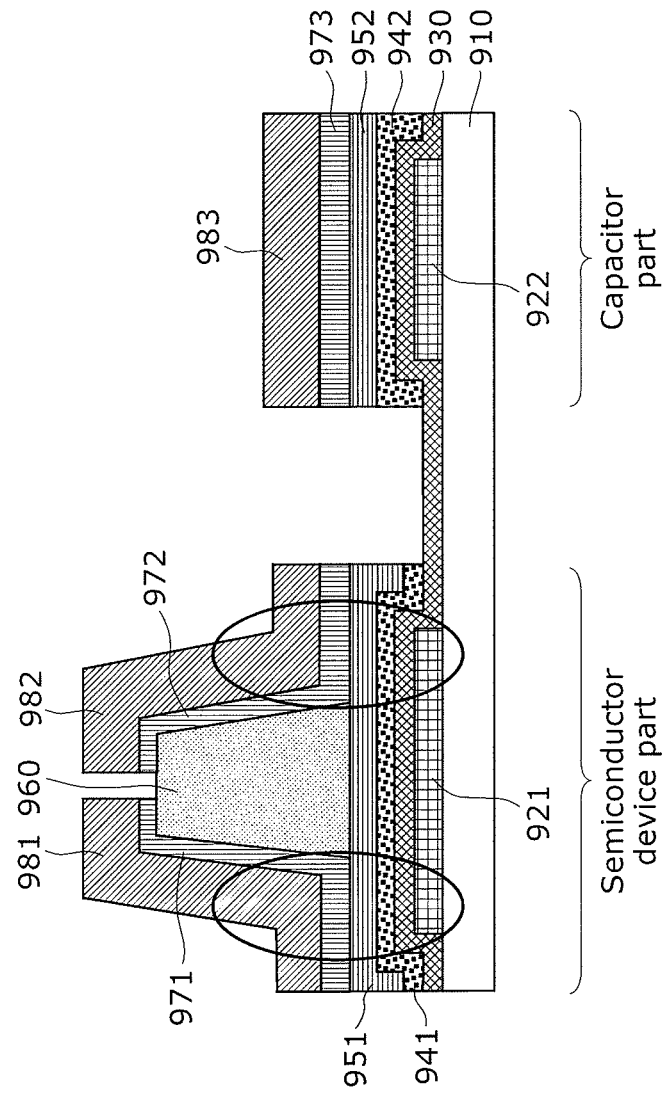
FIG. 11 is a cross-sectional view illustrating the configuration of a conventional pixel circuit.

Next, the variation 2 of the embodiment shall be described with reference to FIG. 9 and FIG. 10. FIG. 9 and FIG. 10 correspond to FIG. 4 and FIG. 6A, respectively. Note that, the description on similarity with the embodiment above is omitted and the description shall be made focusing on the difference.

The pixel 100' in FIG. 9 is different from the pixel 100 in FIG. 4 in that the gate line 21' is formed in a layer different from the gate electrodes 41 and 51. More specifically, the pixel 100' in FIG. 9 includes a passivation film (not illustrated) on the source electrode 53 and the drain electrode 52 illustrated in FIG. 5, and the gate line 21' is formed on the passivation film. The gate line 21' is connected to the gate electrode 41 through the contact hole 71 passing through the gate insulating film 120 and the passivation film. As a result, as illustrated in FIG. 10, the pattern corresponding to the first gate line 21a in FIG. 4 is not necessary in the same layer as the first gate electrodes 41a and 51a, and the first capacitor electrode 61.

For a bottom-gate thin-film transistor, it is necessary to form the gate electrodes 41 and 51 before the channel layer. Accordingly, it is necessary for the material for forming the gate electrodes 41 and 51 to have high heat tolerance, tolerant to a temperature in the laser crystallization process for the channel layer (approximately 600° C.). However, a highly heat-tolerant material usually has high resistance. Accordingly, as illustrated in FIG. 4, if the gate electrode 21 is formed with the material same as the gate electrodes 41 and 51, the line resistance is high.

Accordingly, as illustrated in FIG. 9, forming the gate line 21' in a layer above the gate electrodes 41 and 51 allows forming the gate line 21' and the gate electrodes 41 and 51 with suitable materials. More specifically, the gate line 21' may be formed of a low-resistance material, and the gate electrodes 41 and 51 may be formed of a highly heat-resistant material.

Parasitic capacitance is present at a crosspoint between the gate line 21, the source line 22, and the power supply line 23. Here, the thickness of the passivation film can be more flexibly set than the gate insulating film 120. Accordingly, by providing the gate line 21, the source line 22, and the power supply line 23 above and below the passivation film, it is possible to reduce the parasitic capacitance.

The herein disclosed subject matter is to be considered descriptive and illustrative only, and the appended Claims are of a scope intended to cover and encompass not only the particular embodiment(s) disclosed, but also equivalent structures, methods, and/or uses.

INDUSTRIAL APPLICABILITY

The present disclosure can be effectively used for the thin-film semiconductor device used for the pixel circuit in the display device.

The invention claimed is:

1. A thin-film semiconductor device, comprising:
a substrate;
a semiconductor device; and
a capacitor,
wherein the semiconductor and the capacitor are above the substrate and apart from each other,
the semiconductor device includes:
  a first gate electrode comprising a light-transmitting conductive material above the substrate;
  a second gate electrode comprising a light-shielding conductive material above the first gate electrode;
  a first insulating layer above the second gate electrode;
  a semiconductor layer above the first insulating layer;
  a second insulating layer above the semiconductor layer; and
  a source electrode and a drain electrode that are above the second insulating layer, the capacitor includes:
  a first capacitor electrode comprising a light-transmitting conductive material above the substrate;
  a dielectric layer comprising a same material as the first insulating layer, above the first capacitor electrode; and
  a second capacitor electrode above the dielectric layer, comprising a conductive material same as at least one of the source electrode and the drain electrode, overlapping at least part of the first capacitor electrode in a top view, and
the second gate electrode, the semiconductor layer, and the second insulating layer have outlines that are coincident with one another in a top view.

2. The thin-film semiconductor device according to claim 1,
wherein the first gate electrode and the first capacitor electrode are continuously formed.

3. The thin-film semiconductor device according to claim 1,
wherein the semiconductor device further includes a pair of contact layers, each of which is between the second insulating layer and the source electrode or between the second insulating layer and the drain electrode, and is contacting a side surface of the semiconductor layer.

4. The thin-film semiconductor device according to claim 3,
wherein the capacitor further includes an intermediate layer comprising a same material as the contact layer and being between the dielectric layer and the second capacitor electrode.

5. The thin-film semiconductor device according to claim 1,
wherein the semiconductor layer includes a crystalline silicon thin film.

6. The thin-film semiconductor device according to claim 5,
wherein the semiconductor layer further includes an intrinsic non-crystalline silicon thin film above the crystalline silicon thin film.

7. The thin-film semiconductor device according to claim 6,
wherein the second gate electrode, the crystalline silicon thin film, the intrinsic non-crystalline silicon thin film, and the second insulating layer having outlines that are coincident with one another in the top view.

8. The thin-film semiconductor device according to claim 1,
wherein the second insulating layer comprises an organic material.

9. The thin-film semiconductor device according to claim 1,
wherein the first gate electrode and the first capacitor electrode comprise a same material.

10. The thin-film semiconductor device according to claim 1,
wherein the semiconductor layer includes a crystalline silicon thin film layer, and
the crystalline silicon thin film layer has an outline that is coincident with the outlines of the second gate electrode, the semiconductor layer, and the second insulating layer in the top view.

11. The thin-film semiconductor device according to claim 1,
wherein the semiconductor layer includes an intrinsic non-crystalline silicon thin film layer, and
the intrinsic non-crystalline silicon thin film layer has an outline that is coincident with the outlines of the second gate electrode, the semiconductor layer, and the second insulating layer in the top view.

12. The thin-film semiconductor device according to claim 1,
wherein an outermost periphery of each of the second gate electrode, the semiconductor layer, and the second insulating layer is aligned in a cross-sectional view.

* * * * *